(12) United States Patent
Chen et al.

(10) Patent No.: US 11,150,376 B2
(45) Date of Patent: Oct. 19, 2021

(54) NMR ANTENNA ARRANGEMENT FOR FAST MOVING NMR LOGGING TOOL

(71) Applicant: HALLIBURTON ENERGY SERVICES, INC., Houston, TX (US)

(72) Inventors: Songhua Chen, Katy, TX (US); Arcady Reiderman, Katy, TX (US); Lilong Li, Humble, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 495 days.

(21) Appl. No.: 16/318,099

(22) PCT Filed: Sep. 20, 2016

(86) PCT No.: PCT/US2016/052677
§ 371 (c)(1),
(2) Date: Jan. 15, 2019

(87) PCT Pub. No.: WO2018/056955
PCT Pub. Date: Mar. 29, 2018

(65) Prior Publication Data
US 2021/0286100 A1    Sep. 16, 2021

(51) Int. Cl.
*G01V 3/32* (2006.01)
*G01R 33/36* (2006.01)
(Continued)

(52) U.S. Cl.
CPC .......... *G01V 3/32* (2013.01); *G01R 33/3621* (2013.01); *G01R 33/383* (2013.01); *G01R 33/3808* (2013.01)

(58) Field of Classification Search
CPC ............ G01R 33/3621; G01R 33/3808; G01R 33/383
See application file for complete search history.

(56) References Cited

U.S. PATENT DOCUMENTS

| 5,323,113 A | 6/1994 | Cory et al. |
| 6,018,243 A | 1/2000 | Taicher et al. |

(Continued)

FOREIGN PATENT DOCUMENTS

| WO | 2011159294 A1 | 12/2011 |
| WO | 2015031026 A1 | 3/2015 |

OTHER PUBLICATIONS

Office Action; Brazilian Application No. BR112019003016-6; dated Aug. 12, 2020.
(Continued)

*Primary Examiner* — Gregory H Curran
(74) *Attorney, Agent, or Firm* — Polsinelli PC

(57) ABSTRACT

Disclosed are NMR logging methods and antenna arrangements for fast moving NMR logging tools. The NMR logging tool includes a permanent magnet for inducing a static magnetic field in a formation within a borehole and a transmitter antenna for transmitting a RF pulse sequence into the formation. Two receiver antennae are configured to receive NMR response signals from the formation, the two receiver antennae including a first receiver antenna arranged axially below a second receiver antenna. The first receiver antenna and the second receiver antenna are disposed within a surface area of the transmitter antenna, and the transmitter axial length is substantially the same as an axial length of the two receiver antennae.

19 Claims, 7 Drawing Sheets

(51) Int. Cl.
    *G01R 33/383*    (2006.01)
    *G01R 33/38*    (2006.01)

(56) References Cited

U.S. PATENT DOCUMENTS

| | | |
|---|---|---|
| 6,118,272 A | 9/2000 | Taicher et al. |
| 6,720,765 B2 | 4/2004 | Edwards et al. |
| 6,781,371 B2 | 8/2004 | Taherian et al. |
| 7,012,426 B2 | 3/2006 | Edwards et al. |
| 2004/0046552 A1 | 3/2004 | Taherian et al. |
| 2007/0159170 A1 | 7/2007 | Freytag et al. |
| 2013/0093422 A1 | 4/2013 | Morys et al. |
| 2016/0299249 A1* | 10/2016 | Ramirez ............ G01R 33/3808 |
| 2018/0149765 A1* | 5/2018 | Hurlimann ............ G01R 33/50 |
| 2018/0231682 A1* | 8/2018 | Ramirez ................ G01V 3/32 |

OTHER PUBLICATIONS

International Search Report and Written Opinion; PCT Application No. PCT/US2016/052677; dated Jun. 20, 2017.

\* cited by examiner

NMR ANTENNA ARRANGEMENT FOR FAST MOVING NMR LOGGING TOOL

CROSS-REFERENCE TO RELATED APPLICATIONS

This application is a national stage entry of PCT/US2016/052677 filed Sep. 20, 2016, said application is expressly incorporated herein in its entirety.

TECHNICAL FIELD

The present technology pertains to nuclear magnetic resonance (NMR) logging tools, and more specifically to NMR antenna arrangements for fast moving NMR logging tools.

BACKGROUND

Modern oil field operators demand access to a great quantity of information regarding the parameters and conditions encountered downhole. Such information typically includes characteristics of the lithology, minerology, and pore fluids in the earth formations traversed by the borehole and data relating to the size and configuration of the borehole itself. The collection of information relating to conditions downhole, commonly referred to as logging, can be performed by several methods including wireline logging, tubing-conveyed logging, and logging while drilling (LWD).

One instrument that has been employed through each of these methods is a nuclear magnetic resonance (NMR) logging tool. NMR tools operate by imposing a static magnetic field, $B_0$, to polarize nuclei within the borehole and produce a bulk magnetization parallel to the imposed field. During or after the polarization period, the tool applies a perturbing field, usually in the form of a radio frequency (RF) electromagnetic pulse whose magnetic component, $B_1$, is perpendicular to the static field $B_0$. This perturbing field moves the orientation of the magnetization into the transverse (perpendicular) plane.

As the nuclei gradually repolarize to align with the static field, subsequent RF pulses can be applied to rephrase the nuclei and create a series of induced RF signals known as an echo train. By measuring the time constant associated with the decay of the echo train amplitude, the transverse relaxation time $T_2$ can be determined. As is well known in the art, the $T_2$ relaxation time, as well as other time distribution information such as relaxation time $T_1$, can be readily converted into measurements of porosity (i.e., the relative amount of void space in the formation), pore size distribution, hydrocarbon saturation (i.e., the relative percentage of hydrocarbons and water in the formation fluid), permeability (i.e., the ability of formation fluid to flow from the formation into the well bore), and the like.

During well logging operations, it is often desirable to utilize NMR logging tools to determine characteristics of earth formations over large extents of the borehole. Therefore, it is necessary to move the NMR logging tool at fast speeds (e.g., speeds greater than 30 feet per minute) in order to complete logging in a timely manner. However, current NMR logging tools have a low signal-to-noise-ratio (SNR) and are highly sensitive to axial motion within the borehole making it impractical to move the tools at speeds greater than 20 feet per minute. Some solutions have proposed using two or more receiver antennae within the NMR logging tool to improve axial resolution within the borehole without sacrificing SNR, but these antennae arrangements do not address the motional sensitivity problems associated with current NMR tools. Other solutions have proposed utilizing separate transmitter and receiver antennae with the transmitter antenna having a longer axial length than the receiver antenna. However, in order to maintain the same SNR, the longer transmitter antenna requires substantially more power. Alternatively, using the same power for the longer transmitter antenna will result in a lower SNR.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1A:
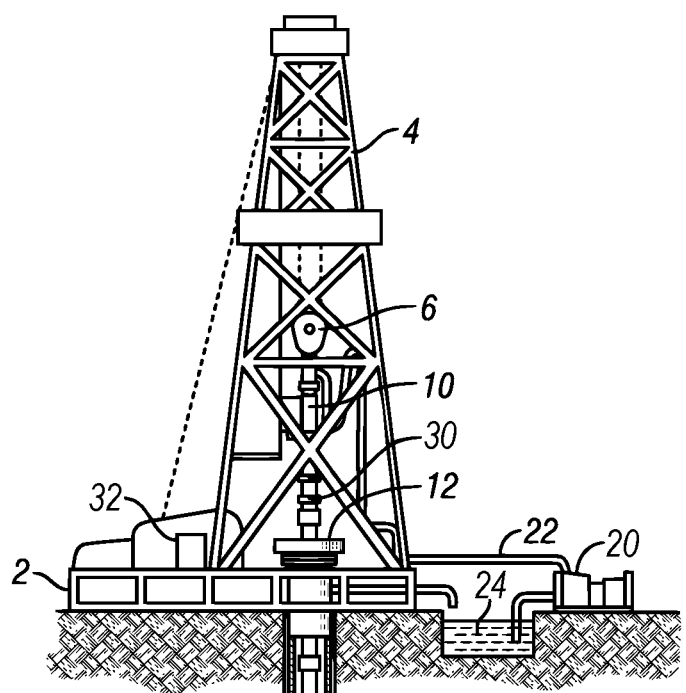
FIG. 1A illustrates a schematic diagram of an example logging-while-drilling (LWD) environment.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The approaches set forth herein describe NMR logging methods and antenna arrangements for fast moving NMR logging tools. The NMR logging tool includes a permanent magnet for inducing a static magnetic field in a formation within a borehole and a transmitter antenna for transmitting a RF pulse sequence into the formation. Two receiver antennae are configured to receive NMR response signals from the formation, the two receiver antennae including a first receiver antenna arranged axially below a second receiver antenna. The first receiver antenna and the second receiver antenna are disposed within a surface area of the transmitter antenna, and the transmitter axial length (i.e., the length in the direction of motion) is substantially the same as an axial length of the two receiver antennae. This arrangement allows for increased SNR when measuring the total porosity of the formation, and enables efficient measurement of the formation's pore size distribution without motional distortion.

The disclosed systems and methods are best understood in the context of the larger systems in which they operate. FIG. 1A shows an illustrative logging while drilling (LWD) environment. A drilling platform 2 supports a derrick 4 having a traveling block 6 for raising and lowering a drill string 8. A kelly 10 supports drill string 8 as it is lowered through a rotary table 12. A drill bit 14 is driven by a downhole motor and/or rotation of drill string 8. As bit 14 rotates, it creates a borehole 16 that passes through various formations 18. A pump 20 circulates drilling fluid through a feed pipe 22 to kelly 10, downhole through the interior of drill string 8, through orifices in drill bit 14, back to the surface via the annulus around drill string 8, and into a retention pit 24. The drilling fluid transports cuttings from the borehole into pit 24 and aids in maintaining the borehole integrity.

An NMR LWD tool 26 can be integrated into the bottom-hole assembly near bit 14. As the bit extends the borehole through the formations, the bottom-hole assembly collects NMR measurements relating to spin relaxation time (e.g., $T_1$, $T_2$, etc.) distributions, as well as various other formation properties and information regarding tool orientation and various other drilling conditions. The NMR logging tool 26 may take the form of a drill collar (i.e., a thick-walled tubular that provides weight and rigidity to aid the drilling process). NMR logging tool 26 can also include one or more navigational packages for determining the position, inclination angle, horizontal angle, and rotational angle of the tool. Such navigational packages can include, for example, accelerometers, magnetometers, and/or sensors.

For purposes of communication, a downhole telemetry sub 28 can be included in the bottom-hole assembly to transfer measurement data to a surface receiver 30 and to receive commands from the surface. Mud pulse telemetry is one common telemetry technique for transferring tool measurements to surface receivers and receiving commands from the surface, but other telemetry techniques can also be used. In some embodiments, telemetry sub 28 can store logging data for later retrieval at the surface when the logging assembly is recovered.

At the surface, surface receiver 30 can receive the uplink signal from the downhole telemetry sub 26 and can communicate the signal to a data acquisition module 32. Module 32 can include one or more processors, storage mediums, input devices, output devices, software, and the like as described in detail in FIGS. 6A and 6B. Module 32 can collect, store, and/or process the data received from NMR logging tool 26 to determine characteristics (e.g., porosity, pore size distribution, permeability, hydrocarbon saturation, etc.) of formations 18.

Figure 1B:
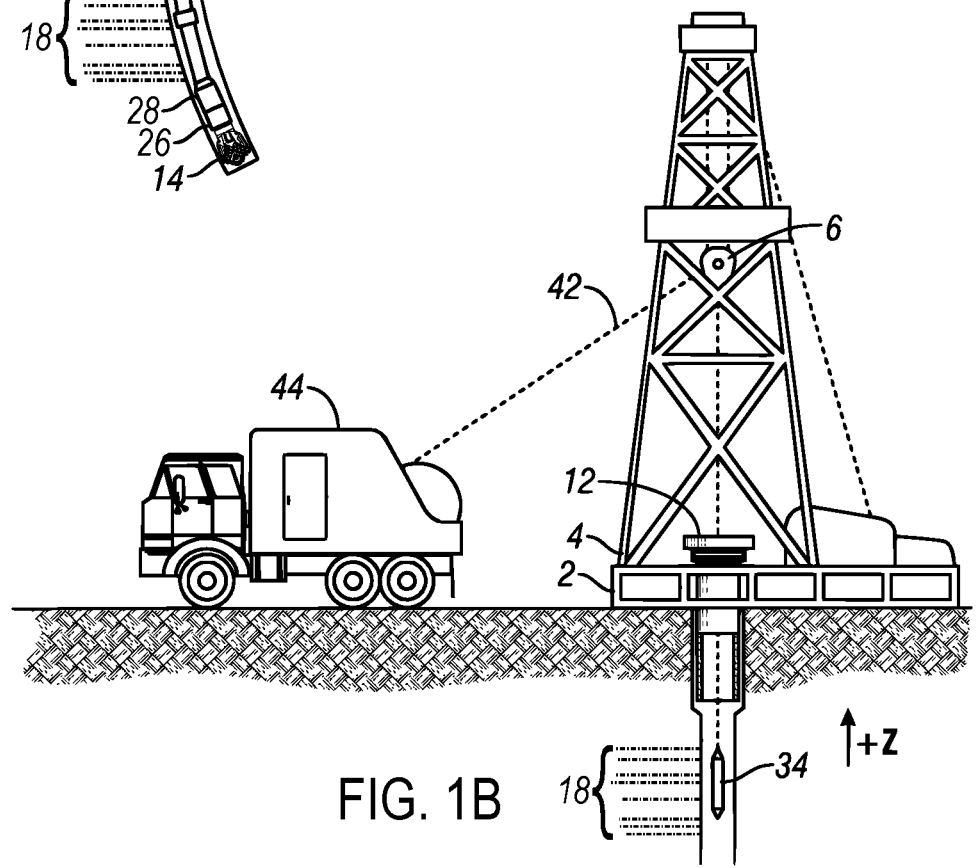
FIG. 1B illustrates a schematic diagram of an example wireline logging environment.

At various times during the drilling process, the drill string 8 may be removed from the borehole as shown in FIG. 1B. Once the drill string has been removed, logging operations can be conducted using a wireline logging tool 34 (i.e., a sensing instrument sonde suspended by a cable 42 having conductors for transporting power to the tool and telemetry from the tool to the surface). Wireline logging tool 34 may have pads and/or centralizing springs to maintain the tool near the central axis of the borehole or to bias the tool towards the borehole wall as the tool is moved downhole or uphole. Wireline logging tool 34 can also include one or more navigational packages for determining the position, inclination angle, horizontal angle, and rotational angle of the tool. Such navigational packages can include, for example, accelerometers, magnetometers, and/or sensors. In some embodiments, a surface measurement system (not shown) can be used to determine the depth of wireline logging tool 34.

As explained further below, tool 34 can include an NMR logging instrument that collects relaxation time distribution measurements associated with formations 18 within the borehole. A logging facility 44 includes a computer system, such as those described with reference to FIGS. 6A and 6B, for collecting, storing, and/or processing the measurements gathered by logging tool 34 (e.g., to determine characteristics such as porosity, pore size distribution, permeability, and/or hydrocarbon saturation of formations 18).

Although FIGS. 1A and 1B depict specific borehole configurations, it should be understood by those skilled in the art that the present disclosure is equally well suited for use in wellbores having other orientations including vertical wellbores, horizontal wellbores, slanted wellbores, multilateral wellbores and the like. Also, even though FIGS. 1A and 1B depict an onshore operation, it should be understood by those skilled in the art that the present disclosure is equally well suited for use in offshore operations. Moreover, it should be understood by those skilled in the art that the present disclosure is not limited to the environments depicted in FIGS. 1A and 1B, and can also be used, for example, in other well operations such as non-conductive production tubing operations, jointed tubing operations, coiled tubing operations, combinations thereof, and the like.

Figure 2:
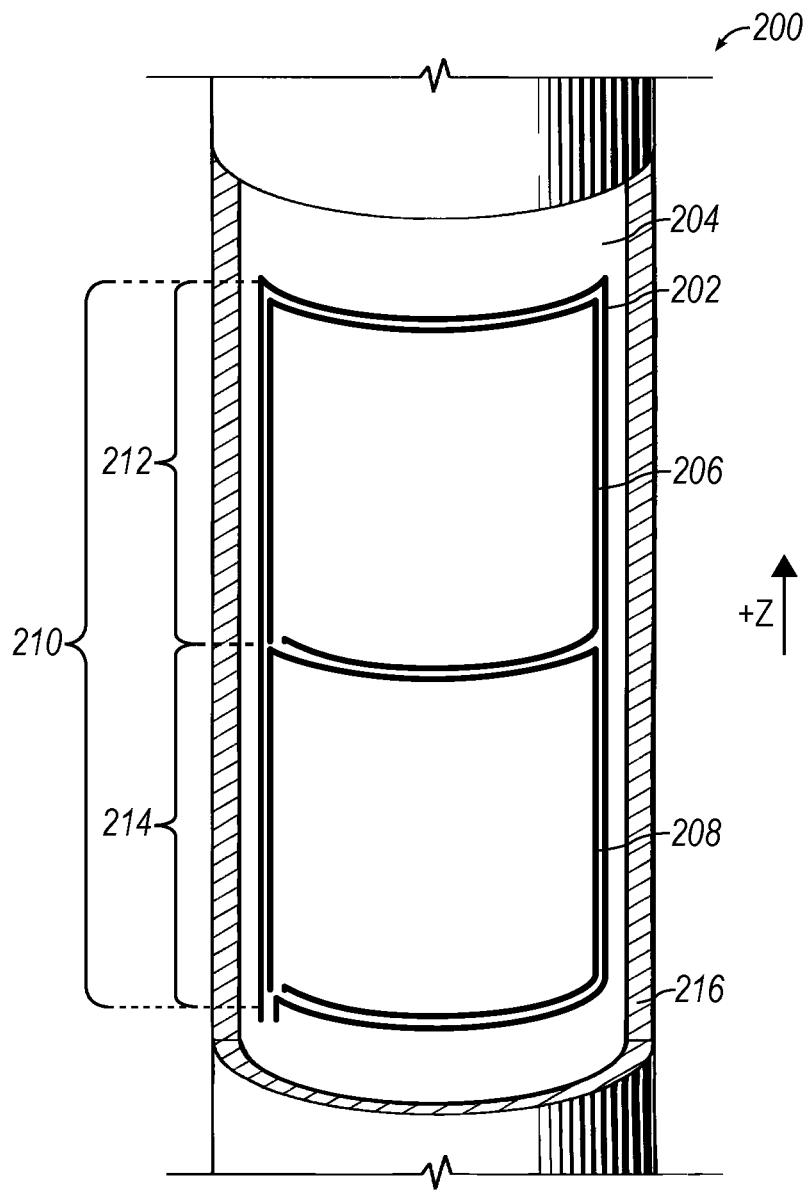
FIG. 2 illustrates a NMR logging tool in accordance with one embodiment of the present disclosure.

FIG. 2 illustrates a NMR logging tool 200 in accordance with an exemplary embodiment of the present disclosure. NMR logging tool 200 includes a transmitter antenna 202 disposed on a magnetic assembly 204. Magnetic assembly 204 can extend axially (i.e., along the Z-axis) within tool 200 and can be substantially cylindrical in shape, although other configurations are contemplated (e.g., a U-shape, a rectangular shape, a hollow cylindrical shape for allowing passage of fluid, etc.). Magnetic assembly 204 can include a soft magnetic core to concentrate magnetic flux and increase the efficiency of the antennae disposed thereon (e.g., transmitter antenna 202 and receiver antennae 206, 208).

Magnetic assembly 204 can also include one or more permanent magnets (not shown) for generating a static magnetic field $B_0$. The permanent magnet(s) can be arranged such that the static magnetic field provides full spin polarization to nuclei within the formation prior to excitation of the nuclei by transmitter antenna 202 when logging at high speeds (e.g., speeds greater than about 30 feet (≈9 meters) per minute). For example, the permanent magnet(s) can extend a sufficient axial distance above and/or below transmitter antenna 202 to ensure full spin polarization of the formation nuclei when logging at high speeds. Such a distance can be determined based on the desired logging speed of tool 200. Alternatively or in addition, a stronger static magnetic field can be created (e.g., by stronger and/or larger permanent magnet(s)) to ensure full spin polarization of the formation nuclei when logging at high speeds.

Disposed within transmitter antenna 202 are two receiver antennae 206, 208. As illustrated in FIG. 2, each receiver antenna 206, 208 can be parallel to transmitter antenna 202. However, in other embodiments, one or more of receiver antennae 206, 208 can be orthogonal to transmitter antenna 202. Further, each of transmitter antenna 202 and receiver antennae 206, 208 can be a single coil (single loop) antenna, although other antenna configurations such as a multiple coil (multi-loop) antenna, a circumferential coil antenna, a helical coil antenna, and the like can be used for one or more of antennae 202, 206, and 208. Moreover, each of transmitter antenna 202 and receiver antennae 206, 208 can be within NMR logging tool 200 (i.e., within a housing defined by the outside protective cover 216) rather than protruding away from tool 200 towards the borehole wall. In this manner, tool 200 can maintain a substantially cylindrical shape throughout its length.

To mitigate or remove the effects of axial motion when conducting logging operations with NMR tool 200, transmitter antenna 202 can be elongated in the axial direction. Preferably, the axial length 210 of transmitter antenna 202 is approximately double the axial length 212, 214 of each of receiver antennae 206, 208 so that the area enclosed (i.e., surface area) by each of receiver antennae 206, 208 is substantially half that of transmitter antenna 202. However, in general, the axial elongation $\Delta l_T$ can be selected such that equation (1) below is satisfied, where $v_{Lm}$ is the logging speed and $T_{Tr}$ is the echo train acquisition time.

$$\Delta l_T \approx v_{Lm} * T_{Tr} \qquad (1)$$

Receiver antenna 208 can be located a fixed axial distance below receiver antenna 206, and each of receiver antennae 206, 208 can be disposed within a surface area of transmitter antenna 202. Moreover, the axial length of the receiver antennae 206, 208 (e.g., the axial length spanned by receiver antennae 206, 208 or the sum of axial lengths 212 and 214) can be substantially the same as axial length 210 of transmitter antenna 202. In this manner, none of the signal induced by transmitter 202 is wasted (i.e., not received by receiver antennae 206 and/or 208) regardless of whether the signal is distorted or undistorted. In the context of the present disclosure, the term substantially can mean that the axial length of the receiver antennae is about ±10% of the axial length of the transmitter antennae, the axial length of the receiver antennae is about ±5% of the axial length of the transmitter antennae, the axial length of the receiver antennae is about ±2% of the axial length of the transmitter antennae, or the axial length of the receiver antennae is about ±1% of the axial length of the transmitter antennae.

A protective cover 216 can surround the various components of NMR logging tool 200 to protect them from the harsh conditions within the borehole. At least a portion of protective cover 216 can be made from a non-conductive material to avoid interfering with the RF field transmitted by transmitter antenna 202 and the NMR signal received by receiver antennae 206, 208. In some embodiments, a portion of protective cover 216 can include a conductive RF screen to focus the RF field from transmitter antenna 202 into the formation.

In operation, NMR logging tool 200 can be raised or lowered within the borehole by, for example, wireline, wellbore tubular, or drill string. As NMR logging tool 200 moves past various formations surrounding the borehole, the one or more permanent magnets within magnetic assembly 204 can induce a static magnetic field $B_0$ that uniformly polarizes nuclei within a formation and creates a bulk magnetization. For example, the permanent magnet(s) in magnetic assembly 204 can create a bulk magnetization that is parallel to the axial axis of NMR logging tool 200 (i.e., along the Z-axis).

During or after polarization, transmitter antenna 202 can transmit a series of RF pulses into the formation to induce a magnetic field, $B_1$, which is substantially perpendicular to the static field $B_0$. The RF pulses can follow a Carr-Purcell-Meiboom-Gill (CPMG) pulse sequence, and the frequency of the pulses can be selected to target specific nuclei (e.g., hydrogen nuclei). In order to generate and transmit the pulse sequence, transmitter antenna 202 can be coupled with various transmitter electronics (not shown), such as power supplies, amplifiers, frequency generators, filters, matching circuitry, and the like.

Figure 3:
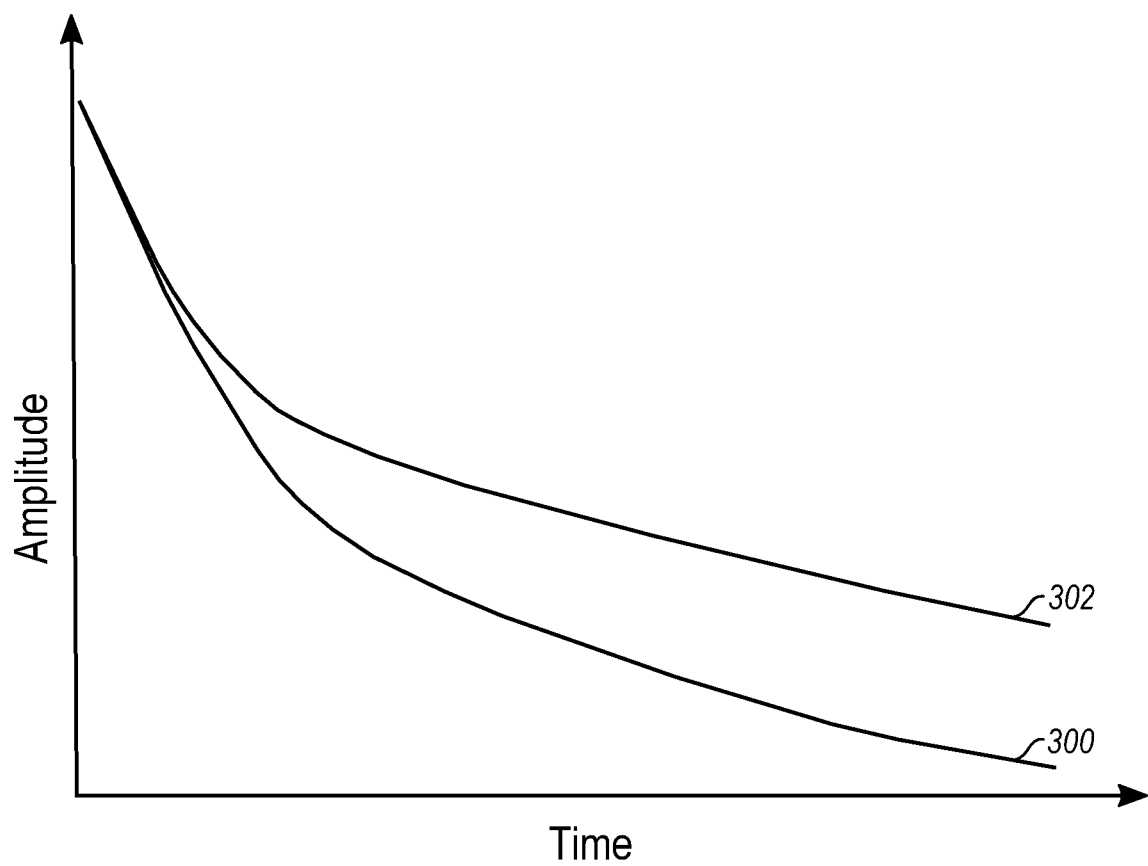
FIG. 3 illustrates a graphical representation of NMR relaxation signals for two receiver antennae in the NMR logging tool.

After transmitting the pulse sequence into the formation, the resulting echo train can be received by each of receiver antennae 206, 208 as NMR logging tool 200 continues to move within the borehole. Once received, the echo train as acquired by each of antennae 206, 208 can be processed to produce two NMR relaxation curves as shown in FIG. 3. The processing of the echo train for each of antennae 206, 208 can be done locally (e.g., by a processor within NMR logging tool 200) or remotely (e.g., sent to the surface for processing and/or stored on a computer-readable medium within NMR logging tool 200 for later processing).

FIG. 3 illustrates exemplary NMR relaxation curves 300, 302 which correspond to receiver antennae 206, 208 respectively for movement of NMR logging tool 200 in the +Z direction (FIG. 2). Each NMR relaxation curve 300, 302 is a function of the measured echo train amplitude over time. The T2 relaxation time distribution can be determined from NMR relaxation curves 300, 302.

As is well known in the art, the $T_2$ relaxation time distribution can used to determine various characteristics of the measured formation including porosity, pore size distribution, hydrocarbon saturation, permeability, and the like. For example, the amplitude of the initial portion (i.e., initial echo) of each NMR relaxation curve 300, 302 is directly related to the total porosity of the measured formation. Thus, to improve the SNR, the initial portion of the NMR relaxation curves 300, 302 from receiver antennae 206, 208 can be stacked or combined. By utilizing the stacked or combined signal to determine the $T_2$ relaxation time, the accuracy of the total porosity measurement can be enhanced.

However, as NMR logging tool 200 moves, the signal acquired by the leading receiver antenna decays quickly because an increasing fraction of the measured volume is new volume which has not been excited by the excitation pulse of the RF pulse sequence. On the other hand, the signal acquired by the trailing receiver antenna remains unaffected and undistorted by the axial motion, as the measured volume has already been excited by the RF pulse sequence due to the elongated transmitter antenna. For instance, it can be seen in FIG. 3 that as NMR logging tool 200 moves in the +Z direction, NMR relaxation curve 300 associated with leading receiver antenna 206 decays at a greater rate than NMR relaxation curve 302 associated with trailing receiver antenna 208. Since the trailing receiver antenna (e.g., receiver antenna 208) remains largely unaffected and undistorted by motion, and because the later echoes in the echo train can tolerate higher noise (lower signal-to-noise ratio), the NMR relaxation curve associated with the trailing receiver (e.g., NMR relaxation curve 302) can be used to conduct pore size distribution assessment with high fidelity. The characteristics of the formation determined using the NMR relaxation curves can be further processed and combined with other information, such as tool depth information, to produce NMR logs of the borehole.

Figure 4:
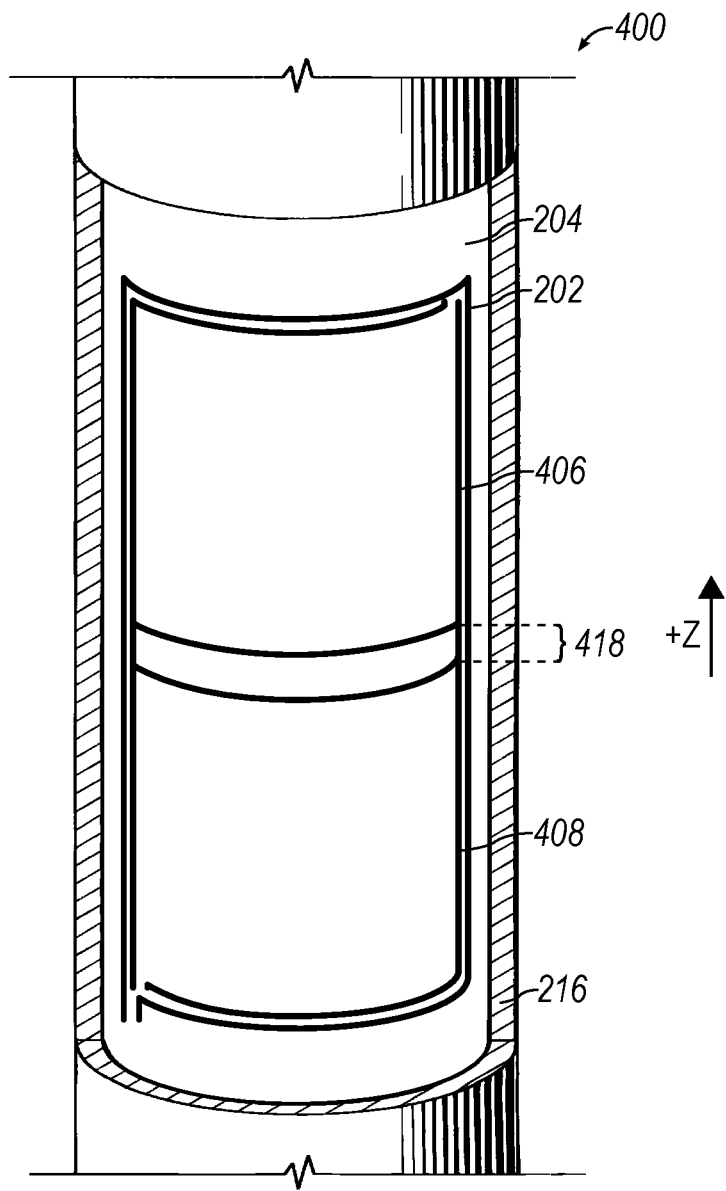
FIG. 4 illustrates a NMR logging tool having decoupled receiver antennae in accordance with another embodiment of the present disclosure.

To ensure the distorted NMR relaxation signal induced on the leading receiver antenna does not induce parasitic signal into the trailing receiver antenna, in some embodiments the two receiver antennae can be decoupled. FIG. 4 illustrates an exemplary embodiment of an NMR logging tool 400 having decoupled receiver antennae. NMR logging tool 400 is substantially similar to tool 200 and therefore, to avoid repetition, only the differences between the two will be described. As illustrated, NMR logging tool 400 includes two receiver antennae 406, 408 having a partial overlap 418 so as to decouple the two receivers. To ensure zero coupling, overlap 418 can be about 10% of the axial length of a receiver antenna. Although FIG. 4 illustrates one possible arrangement for decoupling the two receiver antennae, other arrangements such as orthogonal receiver antennae are also contemplated.

Figure 5:
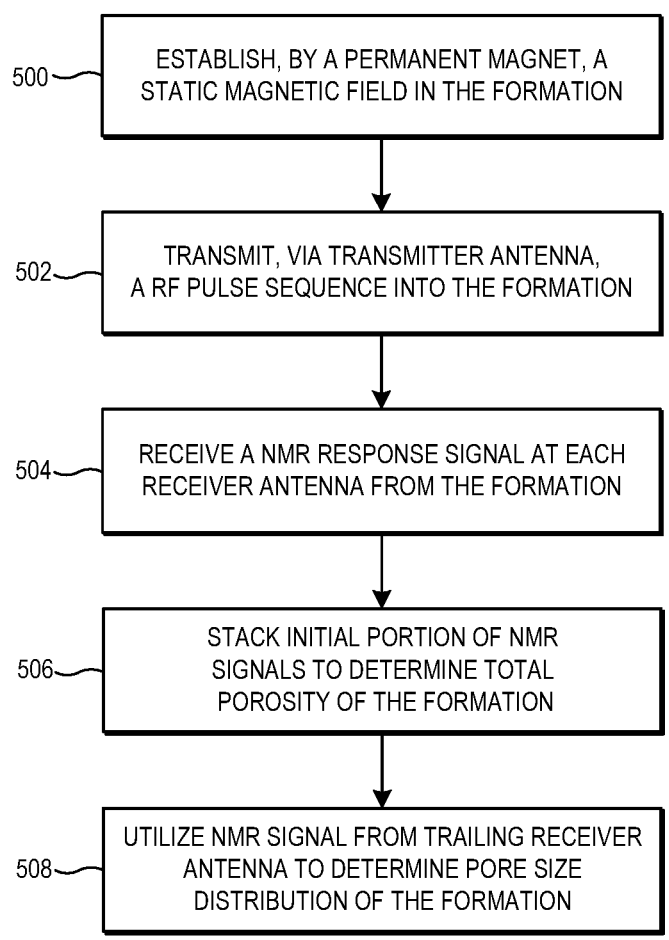
FIG. 5 illustrates an exemplary NMR logging method.

Having disclosed some basic system components and concepts, the disclosure now turns to the example method embodiment shown in FIG. 5. For the sake of clarity, the methods are described in terms of NMR logging tool 200, as shown in FIG. 2, as well as NMR logging tool 400, as shown in FIG. 4, configured to practice the methods. The steps outlined herein can be implemented in any combination thereof, including combinations that exclude, add, or modify certain steps.

FIG. 5 illustrates an example NMR logging method in accordance with the present disclosure. As NMR logging tools 200 or 400 are raised or lowered within the borehole, one or more permanent magnet(s) establish a static magnetic field $B_0$ in a formation surrounding the borehole (step 500). The static magnetic field $B_0$ uniformly polarizes nuclei within the formation and creates a bulk magnetization that is parallel to the axial axis of NMR tool. During or after polarization, a transmitter antenna, such as transmitter antenna 202, can transmit a RF pulse sequence (e.g., a CPMG pulse sequence) into the formation to induce a magnetic field, $B_1$, which is substantially perpendicular to the static field $B_0$ (step 502).

Next, in step 504, each of the receiver antennae in the NMR logging tool 200 or NMR logging tool 400 (e.g., receiver antennae 206, 208 or 406, 408, respectively) can receive a NMR response signal from the formation in the form of an echo train. Once received, the echo train as acquired by each receive antenna can be processed to produce two NMR relaxation curves.

At step 506, the initial portion (e.g., initial echo) of the NMR relaxation curves each receive antenna 206, 208 or 406, 408 can be stacked or combined to improve SNR. The improved SNR signal can then be used to determine the total porosity of the measured formation volume. Next, since the trailing receiver antenna (e.g., receiver antenna 208 or receiver antenna 408 for +Z motion of NMR logging tool 200 or NMR logging tool 400 respectively) remains largely unaffected and undistorted by motion, and because the later echoes in the echo train can tolerate higher noise, the NMR signal associated with the trailing receiver can be used to conduct pore size distribution assessment with high fidelity (step 508).

Figure 6A:
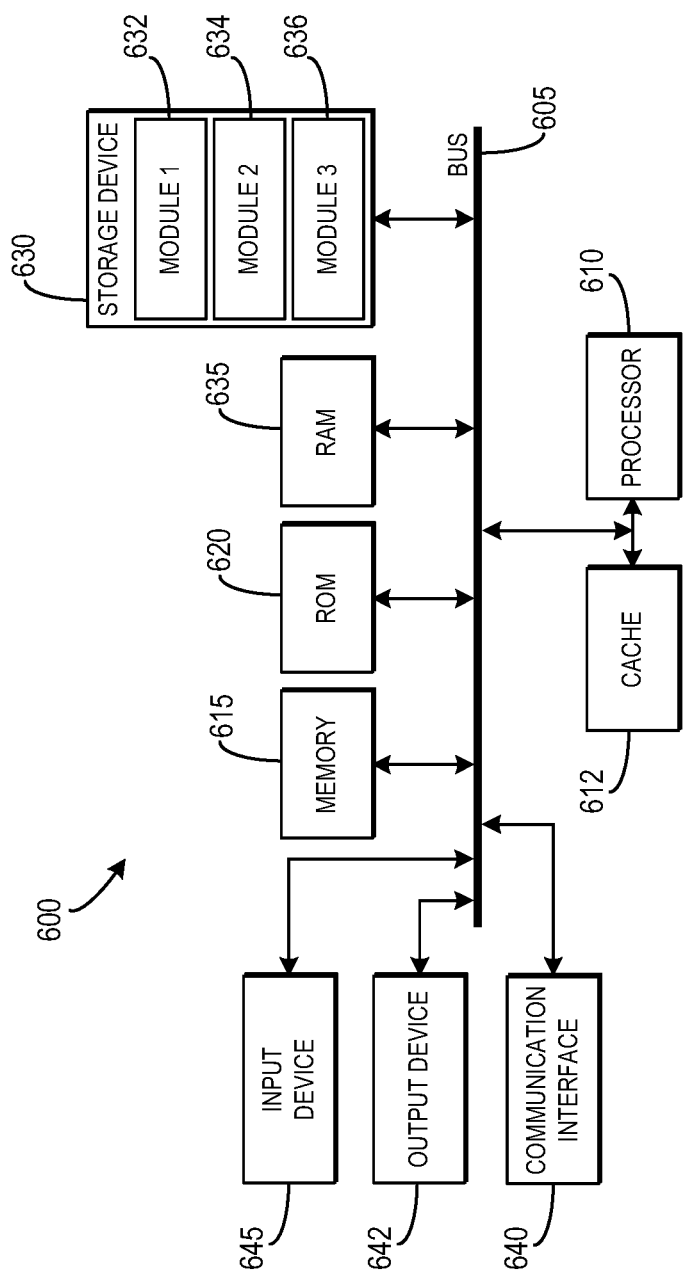
FIGS. 6A and 6B illustrate schematic diagrams of exemplary computing systems for use with the present disclosure.
Figure 6B:
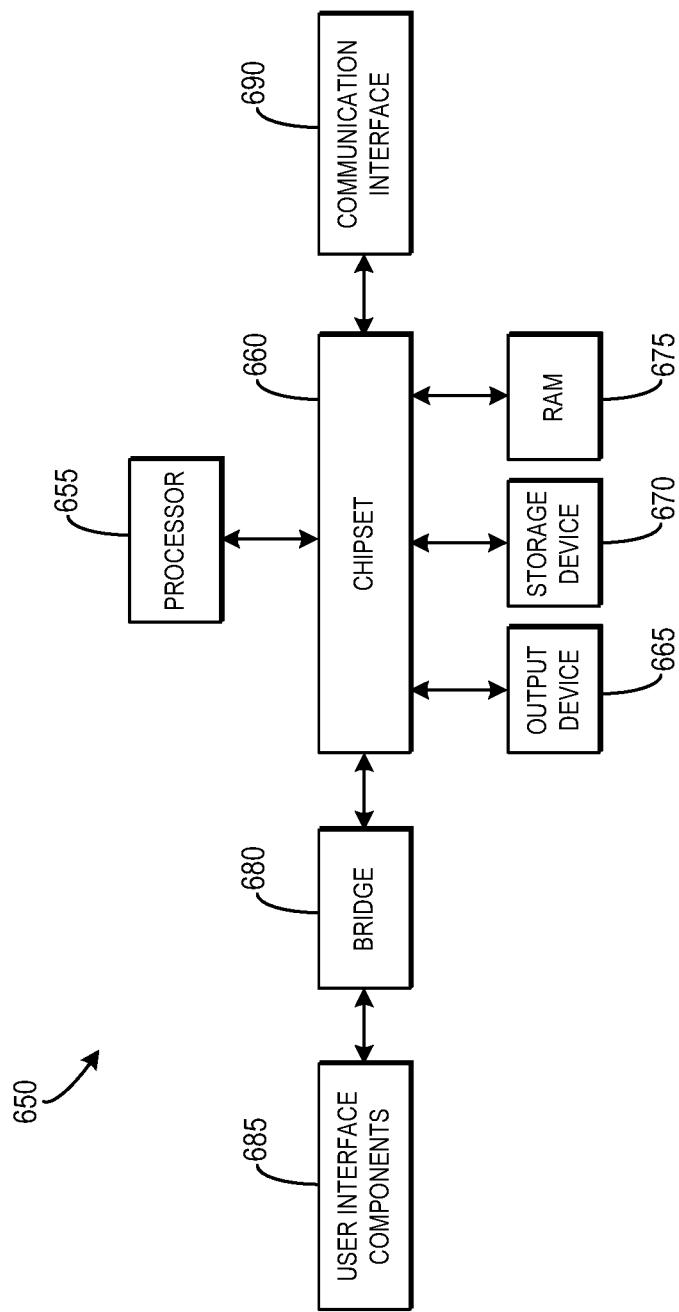

FIG. 6A and FIG. 6B illustrate example computing systems for use with example system embodiments. The more appropriate embodiment will be apparent to those of ordinary skill in the art when practicing the present technology. Persons of ordinary skill in the art will also readily appreciate that other system embodiments are possible.

FIG. 6A illustrates a conventional system bus computing system architecture 600 wherein the components of the system are in electrical communication with each other using a bus 605. System 600 can include a processing unit (CPU or processor) 610 and a system bus 605 that couples various system components including the system memory 615, such as read only memory (ROM) 620 and random access memory (RAM) 625, to the processor 610. The system 600 can include a cache of high-speed memory connected directly with, in close proximity to, or integrated as part of the processor 610. The system 600 can copy data from the memory 615 and/or the storage device 630 to the cache 612 for quick access by the processor 610. In this way, the cache can provide a performance boost that avoids processor 610 delays while waiting for data. These and other modules can control or be configured to control the processor 610 to perform various actions. Other system memory 615 may be available for use as well. The memory 615 can include multiple different types of memory with different performance characteristics. The processor 610 can include any general purpose processor and a hardware module or software module, such as module 1 (632), module 2 (634), and module 3 (636) stored in storage device 630, configured to control the processor 610 as well as a special-purpose processor where software instructions are incorporated into the actual processor design. The processor 610 may essentially be a completely self-contained computing system, containing multiple cores or processors, a bus, memory controller, cache, etc. A multi-core processor may be symmetric or asymmetric.

To enable user interaction with the computing device 600, an input device 645 can represent any number of input mechanisms, such as a microphone for speech, a touch-sensitive screen for gesture or graphical input, keyboard, mouse, motion input, speech and so forth. An output device 642 can also be one or more of a number of output mechanisms known to those of skill in the art. In some instances, multimodal systems can enable a user to provide multiple types of input to communicate with the computing device 600. The communications interface 640 can generally govern and manage the user input and system output. There is no restriction on operating on any particular hardware arrangement and therefore the basic features here may easily be substituted for improved hardware or firmware arrangements as they are developed.

Storage device 630 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 625, read only memory (ROM) 620, and hybrids thereof.

The storage device 630 can include software modules 632, 634, 636 for controlling the processor 610. Other hardware or software modules are contemplated. The storage device 630 can be connected to the system bus 605. In one aspect, a hardware module that performs a particular function can include the software component stored in a computer-readable medium in connection with the necessary hardware components, such as the processor 610, bus 605, output device 642, and so forth, to carry out the function.

FIG. 6B illustrates an example computer system 650 having a chipset architecture that can be used in executing the described method and generating and displaying a graphical user interface (GUI). Computer system 650 can be computer hardware, software, and firmware that can be used to implement the disclosed technology. System 650 can include a processor 655, representative of any number of physically and/or logically distinct resources capable of executing software, firmware, and hardware configured to perform identified computations. Processor 655 can communicate with a chipset 660 that can control input to and output from processor 655. Chipset 660 can output information to output device 665, such as a display, and can read and write information to storage device 670, which can include magnetic media, and solid state media. Chipset 660 can also read data from and write data to RAM 675. A bridge 680 for interfacing with a variety of user interface components 685 can be provided for interfacing with chipset 660. Such user interface components 685 can include a keyboard, a microphone, touch detection and processing circuitry, a pointing device, such as a mouse, and so on. In general, inputs to system 650 can come from any of a variety of sources, machine generated and/or human generated.

Chipset 660 can also interface with one or more communication interfaces 690 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 655 analyzing data stored in storage 670 or 675. Further, the machine can receive inputs from a user via user interface components 685 and execute appropriate functions, such as browsing functions by interpreting these inputs using processor 655.

It can be appreciated that systems 600 and 650 can have more than one processor 610 or be part of a group or cluster of computing devices networked together to provide greater processing capability.

Methods according to the aforementioned description can be implemented using computer-executable instructions that are stored or otherwise available from computer readable media. Such instructions can comprise instructions and data which cause or otherwise configure a general purpose computer, special purpose computer, or special purpose processing device to perform a certain function or group of functions. Portions of computer resources used can be accessible over a network. The computer executable instructions may be binaries, intermediate format instructions such as assembly language, firmware, or source code. Computer-readable media that may be used to store instructions, information used, and/or information created during methods according to the aforementioned description include magnetic or optical disks, flash memory, USB devices provided with non-volatile memory, networked storage devices, and so on.

For clarity of explanation, in some instances the present technology may be presented as including individual functional blocks including functional blocks comprising devices, device components, steps or routines in a method embodied in software, or combinations of hardware and software.

The computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Devices implementing methods according to these disclosures can comprise hardware, firmware and/or software, and can take any of a variety of form factors. Such form factors can include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device.

The instructions, media for conveying such instructions, computing resources for executing them, and other structures for supporting such computing resources are means for providing the functions described in these disclosures.

Although a variety of information was used to explain aspects within the scope of the appended claims, no limitation of the claims should be implied based on particular features or arrangements, as one of ordinary skill would be able to derive a wide variety of implementations. Further and although some subject matter may have been described in language specific to structural features and/or method steps, it is to be understood that the subject matter defined in the appended claims is not necessarily limited to these described features or acts. Such functionality can be distributed differently or performed in components other than those identified herein. Rather, the described features and steps are disclosed as possible components of systems and methods within the scope of the appended claims. Moreover, claim language reciting "at least one of" a set indicates that one member of the set or multiple members of the set satisfy the claim.

STATEMENTS OF THE DISCLOSURE INCLUDE

Statement 1: A nuclear magnetic resonance (NMR) logging tool, comprising: a permanent magnet for inducing a static magnetic field in a formation within a borehole, a transmitter antenna for transmitting a RF pulse sequence into the formation, and two receiver antennae for receiving NMR response signals from the formation, the receiver antennae including a first receiver antenna arranged axially below a second receiver antenna, each of the receiver antennae disposed within a surface area of the transmitter antenna, wherein an axial length of the two receiver antennae is substantially the same as an axial length of the transmitter antenna.

Statement 2: The logging tool according to Statement 1, wherein the two receiver antennae are arranged such that a NMR response signal received by the first receiver antenna is undistorted during upward axial movement of the NMR logging tool within the borehole, and a NMR response signal received by the second receiver antenna is undistorted during downward axial movement of the NMR logging tool within the borehole.

Statement 3: The logging tool according to Statement 1 or 2, wherein the two receiver antennae are decoupled by a partial overlap of the first receiver axial length and the second receiver axial length.

Statement 4: The logging tool according to any of Statements 1-3, wherein the first receiver antenna is orthogonal to the second receiver antenna to decouple the two receiver antennae.

Statement 5: The logging tool according to any of Statements 1-4, wherein each of an axial length of the first receiver and an axial length of the second receiver is half of the axial length of the transmitter antenna.

Statement 6: The logging tool according to any of Statements 1-5, wherein the axial length of the two receiver antennae is about ±10% of the axial length of the transmitter antenna.

Statement 7: The logging tool according to any of Statements 1-6, wherein the transmitter antenna and the receiver antennae are disposed on a soft magnetic core.

Statement 8: The logging tool according to any of Statements 1-7, wherein the tool is deployed within the borehole by one of a wireline, a drill string, or a wellbore tubular.

Statement 9: The logging tool according to any of Statements 1-8, further comprising: a protective cover enclosing the transmitter antenna and the two receiver antennae, wherein at least a portion of the protective cover comprises a non-conductive material.

Statement 10: The logging tool according to any of Statements 1-9, wherein each of the transmitter antenna and the two receiver antennae comprise a single loop coil or a multi-loop coil.

Statement 11: A nuclear magnetic resonance (NMR) logging method, comprising: establishing, by a permanent magnet within a NMR tool, a static magnetic field in a formation within a borehole, transmitting, by a transmitter antenna within the tool, a RF pulse sequence to produce a RF magnetic field within the formation, the RF magnetic field being substantially perpendicular to the static magnetic field, receiving, at a first receiver antenna within the tool, a first NMR response signal from the formation, receiving, at a second receiver antenna within the tool, a second NMR response signal from the formation, and stacking at least a portion of the first and second NMR response signal to determine one or more characteristics of the formation.

Statement 12: The method according to Statement 11, wherein the first receiver antenna and the second receiver antenna are decoupled.

Statement 13: The method according to Statement 11 or 12, wherein the first and second receiver antennae are decoupled by a partial overlap of the first receiver antenna and the second receiver antenna.

Statement 14: The method according to any of Statements 11-13, wherein the first receiver antenna is orthogonal to the second receiver antenna to decouple the first and second antennae.

Statement 15: The method according to any of Statements 11-14, wherein the two receiver antennae are parallel to and disposed within the transmitter antenna, the first receiver antenna located a fixed distance axial below the second receiver antenna.

Statement 16: The method according to any of Statements 11-15, wherein the first receiver antenna has a first receiver axial length, the second receiver antenna has a second receiver axial length, and the transmitter antenna has a transmitter axial length, wherein each of the first receiver axial length and the second receiver axial length are half of the axial length.

Statement 17: The method according to any of Statements 11-16, further comprising: stacking an initial portion of the first NMR signal with an initial portion of the second NRM signal to produce an increased SNR signal, and determining, based on the increased SNR signal, a total porosity of the formation.

Statement 18: The method according to any of Statements 11-17, wherein the first receiver antenna is arranged a fixed axial distance below the second receiver antenna such that the first NMR signal is undistorted during upward axial movement of the NMR tool within the borehole, and the second NMR signal is undistorted during downward axial movement of the NMR logging tool within the borehole.

Statement 19: The method according to any of Statements 11-18, further comprising: determining a direction of movement of the tool within the borehole, selecting, based on the direction, one of the first NMR signal or the second NMR signal, and determining, based on the selected signal, a pore size distribution of the formation.

Statement 20: The method according to any of Statements 11-19, wherein the tool is deployed within the borehole by one of a wireline, a drill string, or a wellbore tubular.

We claim:

1. A nuclear magnetic resonance (NMR) logging tool, comprising:
   a permanent magnet for inducing a static magnetic field in a formation within a borehole;
   a transmitter antenna for transmitting a RF pulse sequence into the formation; and
   two receiver antennae for receiving NMR response signals from the formation, the receiver antennae including a first receiver antenna arranged axially below a second receiver antenna, each of the receiver antennae disposed within a surface area of the transmitter antenna, wherein an axial length of the two receiver antennae is substantially the same as an axial length of the transmitter antenna.

2. The logging tool of claim 1, wherein the two receiver antennae are arranged such that a NMR response signal received by the first receiver antenna is undistorted during upward axial movement of the NMR logging tool within the borehole, and a NMR response signal received by the second receiver antenna is undistorted during downward axial movement of the NMR logging tool within the borehole.

3. The logging tool of claim 1, wherein the two receiver antennae are decoupled by a partial overlap of the first receiver axial length and the second receiver axial length.

4. The logging tool of claim 1, wherein the first receiver antenna is orthogonal to the second receiver antenna to decouple the two receiver antennae.

5. The logging tool of claim 1, wherein each of an axial length of the first receiver antenna and an axial length of the second receiver antenna is half of the axial length of the transmitter antenna.

6. The logging tool of claim 1, wherein the axial length of the two receiver antennae is about ±10% of the axial length of the transmitter antenna.

7. The logging tool of claim 1, wherein the transmitter antenna and the receiver antennae are disposed on a soft magnetic core.

8. The logging tool of claim 1, wherein the tool is deployed within the borehole by one of a wireline, a drill string, or a wellbore tubular.

9. The logging tool of claim 1, further comprising:
a protective cover enclosing the transmitter antenna and the two receiver antennae, wherein at least a portion of the protective cover comprises a non-conductive material.

10. The logging tool of claim 1, wherein each of the transmitter antenna and the two receiver antennae comprise a single loop coil or a multi-loop coil.

11. A nuclear magnetic resonance (NMR) logging method, comprising:
establishing, by a permanent magnet within a NMR tool, a static magnetic field in a formation within a borehole;
transmitting, by a transmitter antenna within the tool, a RF pulse sequence to produce a RF magnetic field within the formation, the RF magnetic field being substantially perpendicular to the static magnetic field;
receiving, at a first receiver antenna within the tool, a first NMR response signal from the formation;
receiving, at a second receiver antenna within the tool, a second NMR response signal from the formation; and
stacking at least a portion of the first and second NMR response signal to determine one or more characteristics of the formation,
wherein the first receiver antenna has a first receiver axial length, the second receiver antenna has a second receiver axial length, and the transmitter antenna has a transmitter axial length, wherein each of the first receiver axial length and the second receiver axial length are half of the transmitter axial length.

12. The method of claim 11, wherein the first receiver antenna and the second receiver antenna are decoupled.

13. The method of claim 12, wherein the first and second receiver antennae are decoupled by a partial overlap of the first receiver antenna and the second receiver antenna.

14. The method of claim 12, wherein the first receiver antenna is orthogonal to the second receiver antenna to decouple the first and second antennae.

15. The method of claim 11, wherein the two receiver antennae are parallel to and disposed within the transmitter antenna, the first receiver antenna located a fixed axial distance below the second receiver antenna.

16. The method of claim 11, further comprising:
stacking an initial portion of the first NMR signal with an initial portion of the second NRM signal to produce an increased SNR signal; and
determining, based on the increased SNR signal, a total porosity of the formation.

17. The method of claim 11, wherein the first receiver antenna is arranged a fixed axial distance below the second receiver antenna such that the first NMR signal is undistorted during upward axial movement of the NMR tool within the borehole, and the second NMR signal is undistorted during downward axial movement of the NMR logging tool within the borehole.

18. The method of claim 17, further comprising:
determining a direction of movement of the tool within the borehole;
selecting, based on the direction, one of the first NMR signal or the second NMR signal; and
determining, based on the selected signal, a pore size distribution of the formation.

19. The method of claim 11, wherein the tool is deployed within the borehole by one of a wireline, a drill string, or a wellbore tubular.

* * * * *